United States Patent
Sayama

(10) Patent No.: US 9,112,013 B2
(45) Date of Patent: Aug. 18, 2015

(54) SEMICONDUCTOR DEVICE AND METHOD FOR PRODUCING THE SAME

(71) Applicant: Renesas Electronics Corporation, Kanagawa (JP)

(72) Inventor: Hirokazu Sayama, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/785,674

(22) Filed: Mar. 5, 2013

(65) Prior Publication Data

US 2013/0234258 A1 Sep. 12, 2013

(30) Foreign Application Priority Data

Mar. 12, 2012 (JP) ................ 2012-054170

(51) Int. Cl.
*H01L 29/78* (2006.01)
*H01L 29/66* (2006.01)
*H01L 29/10* (2006.01)
*H01L 27/092* (2006.01)
*H01L 29/06* (2006.01)
*H01L 21/8238* (2006.01)

(52) U.S. Cl.
CPC ........ *H01L 29/78* (2013.01); *H01L 21/823814* (2013.01); *H01L 27/0922* (2013.01); *H01L 29/1083* (2013.01); *H01L 29/66477* (2013.01); *H01L 29/66659* (2013.01); *H01L 29/7835* (2013.01); *H01L 21/823807* (2013.01); *H01L 29/0692* (2013.01); *H01L 29/1087* (2013.01)

(58) Field of Classification Search
USPC ......................... 257/288, 401, 901
See application file for complete search history.

(56) References Cited

U.S. PATENT DOCUMENTS

| | | | |
|---|---|---|---|
| 5,132,235 | A | 7/1992 | Williams et al. |
| 6,893,926 | B2 | 5/2005 | Kikuchi et al. |
| 7,986,004 | B2 | 7/2011 | Ohdaira et al. |
| 8,004,040 | B2 | 8/2011 | Ichijo et al. |
| 8,304,820 | B2 * | 11/2012 | Yamakoshi et al. .......... 257/288 |
| 2006/0076612 | A1 | 4/2006 | Otake et al. |
| 2008/0017897 | A1 * | 1/2008 | Saito et al. .................. 257/288 |

(Continued)

FOREIGN PATENT DOCUMENTS

| | | |
|---|---|---|
| JP | 2004-31804 A | 1/2004 |
| JP | 2006-128640 A | 5/2006 |
| JP | 2008-004649 A | 1/2008 |
| JP | 2009-152371 A | 7/2009 |

OTHER PUBLICATIONS

Communication dated Jun. 23, 2015 from the Japanese Patent Office in counterpart application No. 2012-054170.

(Continued)

*Primary Examiner* — David Vu
*Assistant Examiner* — Jonathan Han
(74) *Attorney, Agent, or Firm* — Sughrue Mion, PLLC

(57) ABSTRACT

Provided are a semiconductor device having a high breakdown voltage and attaining the restraint of the action of a parasitic bipolar transistor, and a method for producing the device. A high-breakdown-voltage p-channel-type transistor included in the semiconductor device has a first n-type semiconductor layer arranged in a semiconductor substrate and at a main-surface-side (upside) of a p-type region in the semiconductor substrate, and a local n-type buried region arranged just below a first p-type dopant region to contact the first n-type semiconductor layer.

14 Claims, 18 Drawing Sheets

(56) References Cited

U.S. PATENT DOCUMENTS

| | | |
|---|---|---|
| 2010/0148256 A1 | 6/2010 | Chang |
| 2011/0101425 A1 | 5/2011 | Grote et al. |
| 2012/0086052 A1* | 4/2012 | Chen et al. ............... 257/288 |
| 2012/0217555 A1* | 8/2012 | Saito et al. ............... 257/288 |
| 2013/0020635 A1* | 1/2013 | Yilmaz et al. ............... 257/334 |

OTHER PUBLICATIONS

R. Sorge et al., "Integration of Isolated RF-LDMOS Transistors in a 0.25 μm SiGe:C BICMOS Process", Bipolar/BiCMOS Circuits and Technology Meeting (BCTM), Oct. 9, 2011, pp. 162-165.

* cited by examiner

SEMICONDUCTOR DEVICE AND METHOD FOR PRODUCING THE SAME

CROSS-REFERENCE TO RELATED APPLICATIONS

The disclosure of Japanese Patent Application No. 2012-054170 filed on Mar. 12, 2012 including the specification, drawings and abstract is incorporated herein by reference in its entirety.

BACKGROUND

The present invention relates to a semiconductor device, and a method for producing the device, in particular, a technique that can be used suitably for a semiconductor device having a high-breakdown-voltage transistor.

For example, a MOSFET (metal oxide semiconductor field effect transistor) used in the state that a high voltage of several tens of volts is applied to a drain region thereof is disclosed in Japanese Unexamined Patent Application Publication (JP-A) No. 2008-4649 (Patent Document 1). According to this publication, a buried layer is formed between a semiconductor substrate and a semiconductor layer over the substrate. In order that the buried layer can restrain the action of a parasitic bipolar transistor generated in the vertical direction (in the upper and lower direction), the concentration of a dopant (impurity) in the buried layer, which corresponds to the base of the parasitic transistor, is made sufficiently large.

PRIOR DOCUMENT

Patent Document

[Patent Document 1] Japanese Unexamined Patent Application Publication No. 2008-4649

SUMMARY

However, it is necessary to use a single photomask (working mask) for forming the buried layer other than a photomask for forming the other regions. Moreover, the semiconductor layer is formed by epitaxial growth; thus, costs may be increased through the steps making use of the photomask and the epitaxial growth. It is therefore an object of the invention to reduce costs when a high-breakdown-voltage MOSFET is produced while the action of a parasitic bipolar transistor is restrained.

Other objects and new features of the present invention will be made evident from the description of the present specification, and the attached drawings.

According to a first aspect of the invention, a high-breakdown-voltage p-channel-type transistor included in a semiconductor device has a first n-type semiconductor layer arranged in a semiconductor substrate and at a main-surface-side (upside) of a p-type region (in the semiconductor substrate), and a local n-type buried region arranged, just below a first p-type dopant region from which a drain region is taken out, to contact the first n-type semiconductor layer.

According to a second aspect of the invention, a method for producing a semiconductor device having a high-breakdown-voltage p-channel-type transistor includes: forming a first n-type semiconductor layer inside the semiconductor substrate and at the main-surface-side (upside) of a p-type region in the semiconductor substrate; and forming a local n-type buried region, just below a first p-type dopant region from which a drain region is taken out, to contact the first n-type semiconductor layer. The same mask is used to conduct the step of forming the first p-type dopant region and the step of forming the local n-type buried region.

According to the first aspect, the local n-type buried region increases the thickness of a region corresponding to the base of a parasite bipolar transistor to make it possible to promote an advantageous effect of restraining the action of the parasite bipolar transistor.

According to the second aspect, it becomes unnecessary to use an additional photomask for forming the local n-type buried layer. Thus, production costs for the semiconductor device can be reduced.

DETAILED DESCRIPTION

Hereinafter, embodiments of the invention will be described with reference to the drawings.

First Embodiment

First, with reference to FIG. 1, a description will be made about the configuration of individual element-formed regions in a main surface of a semiconductor substrate SUB of a semiconductor device DEV according to first embodiment of the invention.

Figure 1:
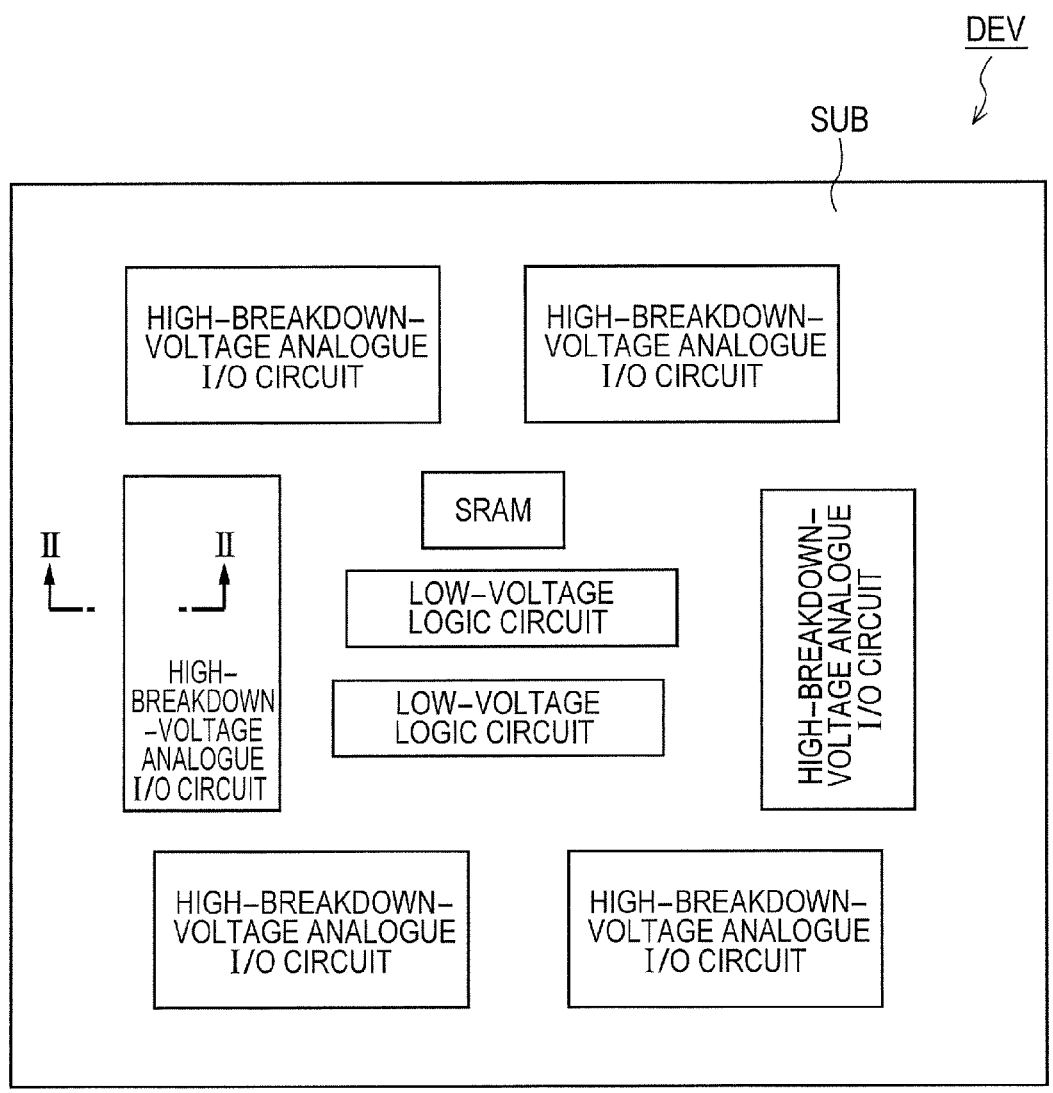
FIG. 1 is a schematic plan view of a semiconductor device according to first embodiment of the present invention.

As illustrated in FIG. 1, the semiconductor device DEV of the present embodiment has, in the main surface of the semiconductor substrate SUB, for example, regions in each of which a high-breakdown-voltage analogue I/O circuit is formed, a region where a low-voltage logic circuit is formed, a region where a low-voltage analogue circuit is formed, and a region where the so-called SRAM (static random access memory) is formed.

The high-breakdown-voltage analogue I/O circuits are each a circuit usable in the state that a driving voltage higher than ordinarily used voltages is applied to this circuit, and usable in order to input and output electrical signals between this circuit, and a power supply circuit as well as the low-voltage logic circuit and others. The low-voltage logic circuit is a circuit having a control circuit, for example, a logic circuit composed of plural MIS transistors or others in order to make arithmetic calculations, using digital signals. The low-voltage analogue circuit is a circuit driven by effect of a low voltage equivalent to the voltage for the low-voltage logic circuit. However, this circuit is a circuit for making arithmetic calculations, using analogue signals. The SRAM includes plural MIS transistors, and is used as an element for memorizing data inside the present semiconductor device. The semiconductor device also has, for example, a region where the power supply circuit is formed, which is not illustrated in FIG. 1. The power supply circuit is a circuit for supplying a supply voltage for driving each of the above-mentioned circuits.

Figure 2:
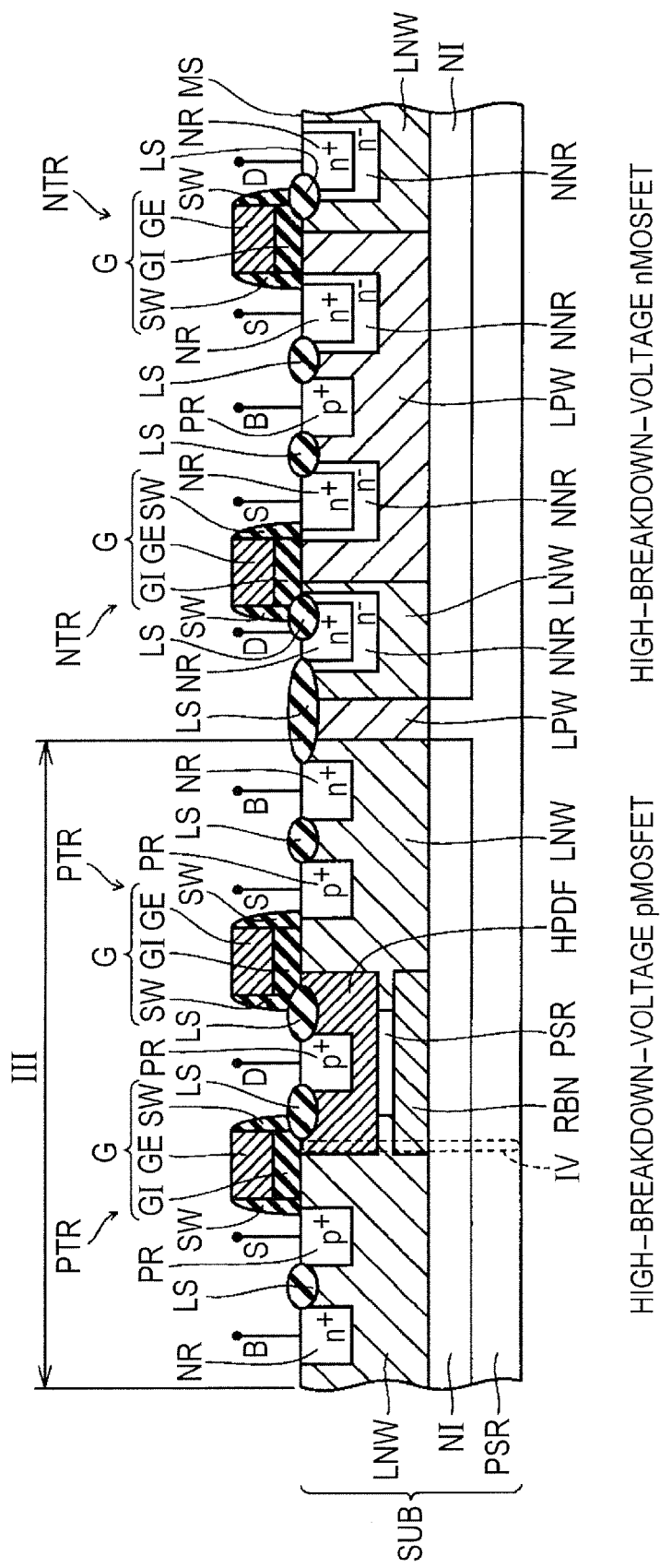
FIG. 2 is a schematic sectional view illustrating the configuration and the structure of MOSFETs in a region where a high-breakdown-voltage analogue I/O circuit in FIG. 1 is formed in first embodiment.

FIG. 2 is a schematic sectional view of a region taken along line II-II in FIG. 1. The analogue I/O circuits in FIG. 1 each have, for example, the so-called high-breakdown-voltage pMOSFET (high-breakdown-voltage p-channel type transistor) as illustrated in the sectional view of FIG. 2. The high-breakdown-voltage pMOSFET denotes a p-channel type MOS transistor having a breakdown-voltage performance against a high drain voltage of, for example, 10 V or more.

As illustrated in FIG. 2, the region where each of the high-breakdown-voltage analogue I/O circuits in FIG. 1 is formed has not only the above-mentioned pMOSFET but also a high-breakdown-voltage nMOSFET (high-breakdown-voltage n-channel-type transistor). In substantially the same manner as the high-breakdown-voltage pMOSFET, the high-breakdown-voltage nMOSFET denotes an n-channel-type MOS transistor having a breakdown-voltage performance against a high drain voltage of, for example, 10 V or more.

Figure 3:
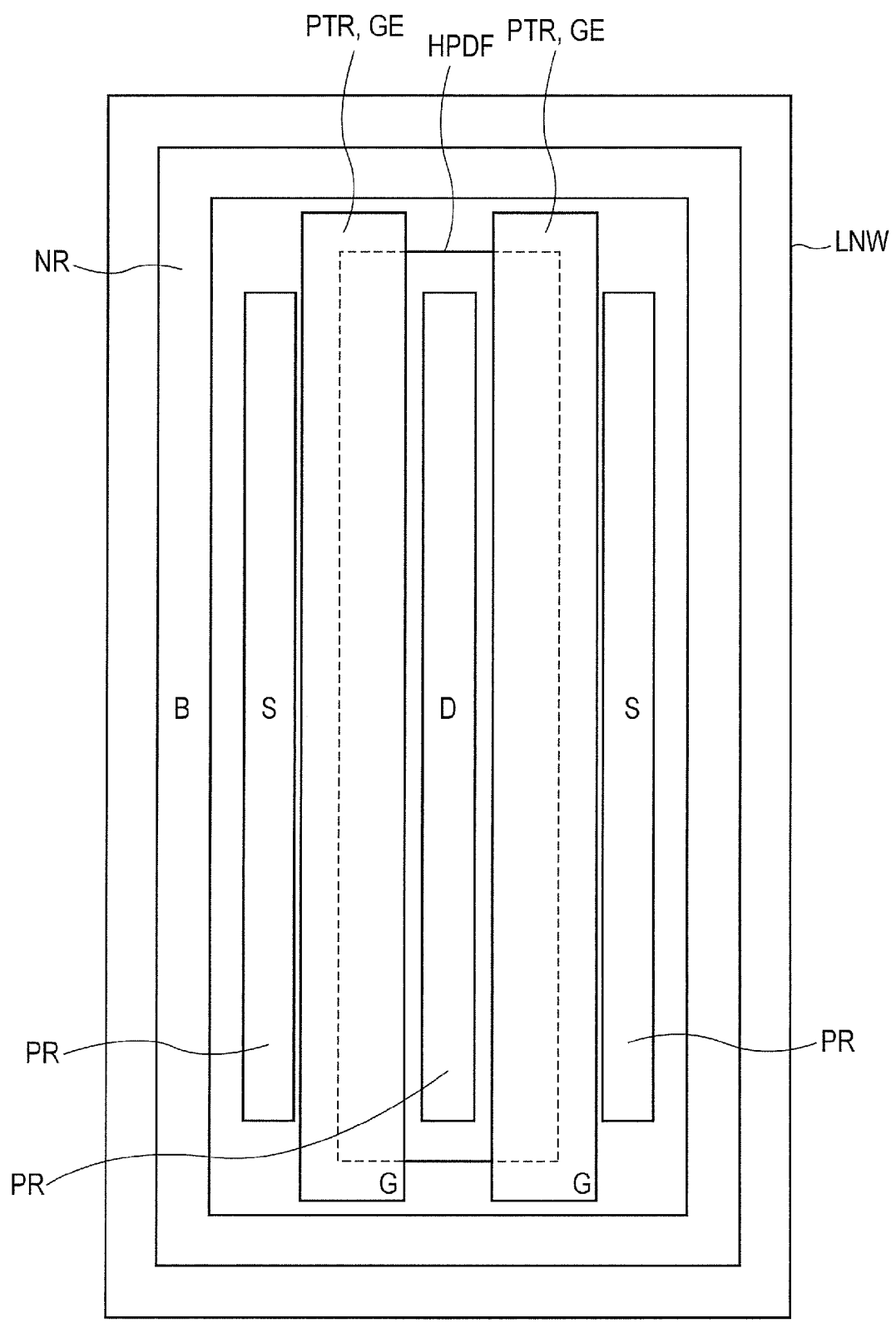
FIG. 3 is a schematic plan view illustrating a portion of the structure of a region represented by "III" in FIG. 2, this portion being a portion wherein a p-type dopant region PR as a first p-type dopant region is excluded from the structure.

The high-breakdown-voltage pMOSFET mainly has an n-type buried layer NI (first n-type semiconductor layer), a local n-type buried region RBN, an n-type well region LNW, a p-type drift layer HPDF for high breakdown voltage, an n-type dopant region NR, p-type dopant regions PR, gate electrons G, and an element isolation insulating film LS. These are formed in the semiconductor substrate SUB, which is made of, for example, silicon monocrystal and has a p-type region PSR containing a p-type dopant. As illustrated in FIG. 3, these individual regions are extended basically in a direction perpendicular to surfaces of the paper on which FIG. 2 is drawn.

The p-type region PSR is a dopant region where ions of a p-type dopant, such as boron, are introduced into the silicon monocrystal. The n-type buried layer NI is a dopant region arranged to be buried in the semiconductor substrate SUB and containing ions of an n-type dopant, such as phosphorous. The n-type buried layer NI is arranged at the main surface side of the semiconductor substrate SUB (that is, over the p-type region PSR), this main surface being represented by MS, when viewed from the p-type region PSR. The n-type buried layer NI is arranged, for example, to contact the upper side of the p-type region PSR. The n-type buried layer NI is an n-type semiconductor layer for attaining, inside the semiconductor substrate SUB, electrical isolation of the p-type region PSR from the p-type dopant regions (such as the p-type drift layer HPDF for high breakdown voltage) at the semiconductor substrate SUB main surface MS side of the p-type region PSR.

In the same manner as introduced into the p-type region PSR, p-type dopant ions are introduced into central one out of the p-type dopant regions PR, as well as into the high-breakdown-voltage p-type drift layer HPDF. The p-type dopant region PR, and the high-breakdown-voltage p-type drift layer HPDF formed to surround the region PR are each a region (first p-type dopant region) formed in the main surface MS of the semiconductor substrate SUB in order to take out a drain electrode D. It is preferred that the p-type dopant in the p-type drift layer HPDF is higher in concentration than the p-type dopant in the p-type region PSR and is lower in concentration than the p-type dopant in the p-type dopant region PR surrounded by the p-type drift layer HPDF (in order to take out the drain electrode D).

The high-breakdown-voltage p-type drift layer HPDF is a region formed in the main surface MS in order to attain a smoother electric connection between the p-type dopant region PR surrounded by the layer HPDF, and the p-type region PSR. Even if a high voltage is applied to the drain electrode D, the arrangement of the high-breakdown-voltage p-type drift layer HPDF makes it possible to restrain the generation of inconveniences following a matter that an electric field becomes extremely high in the high-breakdown-voltage p-type drift layer HPDF and the vicinity thereof.

In the main surface MS of the semiconductor substrate SUB, the other of the p-type dopant regions PR is together formed as a region (second p-type dopant region) from which source electrodes S are taken out. The drain electrode D, the dopant region from which the source electrodes S are taken out, and gate electrodes G constitute p-type transistors PTR as the high-breakdown-voltage pMOSFET. In FIG. 2, therefore, the p-type transistors PTR are illustrated in a number of two. The two p-type transistors PTR have the following members commonly to each other: the drain electrode D; the p-type dopant region PR from which the drain electrode D is taken out; and the high-breakdown-voltage p-type drift HPDF.

The respective gate electrodes G of the two p-type transistor PTR are each composed of a gate insulating film GI that is, for example, a silicon oxide film, a gate voltage applying region GE to which a voltage is applied, and a side wall insulating film SW that is, for example, a silicon oxide film.

In the main surface MS of the semiconductor substrate SUB, the n-type well region LNW is formed. In a region of the main surface MS which is a region where the n-type well region LNW is formed, partly, the following members are formed: the p-type dopant region PR from which the source electrodes S are taken out; and the n-type dopant region NR from which base potential B is taken out. In other words, the n-type well region LNW is formed in the main surface MS to surround the periphery of the p-type dopant region PR from which the source electrodes S are taken out, and that of the n-type dopant region NR from which the base potential B is taken out. In the same manner as introduced into the n-type buried layer NI, ions of an n-type dopant are introduced into the n-type well region LNW and the n-type dopant region NR.

The n-type dopant region NR, from which the base potential B is taken out, has a function of connecting the base potential B electrically with the n-type well region LNW, thereby fixing the potential of the n-type well region LNW. As illustrated in FIG. 3, it is preferred that the n-type dopant region NR, from which the base potential B is taken out, is arranged, for example, to surround the (paired) p-type transistors PRT when these are viewed in plan.

It is preferred that the n-type well region LNW is arranged to include at least one portion of a region just below each of the gate electrodes G. According to this manner, in the main surface MS and the n-type well region LNW near the main surface MS, a channel region causing an electric field effect of each of the p-type transistors PTR is formed, in particular, in at least one portion of a region sandwiched between its drain electrode D and its source electrode S. This electric field effect is caused by a voltage applied to the gate electrode G (gate voltage applying region GE) just above the channel.

The element isolation insulating film LS is an insulating film formed as, for example, a silicon oxide film on/in, for example, at least one portion of a region sandwiched between the base potential B and the source electrode S, this region being a region of the main surface MS, in order to isolate the p-type transistors PTR, which are adjacent ones out of all p-type transistors in the present device. The element isolation film LS is formed through, for example, the so-called LOCOS (local oxidation of silicon) process or STI (shallow trench isolation) process.

The element isolating insulating film LS is preferably formed in, for example, at least one portion (for example, a portion just below the side wall insulating film SW) of a region sandwiched between the gate electrode G of each of the p-type transistors PTR and the drain electrode D thereof, this region being a region of the main surface MS. The element isolation insulating film LS formed in this region restrains the generation of a portion extremely low in dopant concentration in the channel region of the p-type transistor PTR, which is formed in, for example, the main surface MS of the n-type well region LNW and the vicinity of the main surface MS by ion implantation. This portion, low in dopant concentration, may cause a fall in the electric field effect to induce an inconvenience that the threshold voltage of the gate electrode G becomes very high. Thus, when the element isolation insulating film LS is formed in a portion that may, with a high probability, become this portion, which is low in dopant concentration, a portion high in threshold voltage is substantially extinguished just below the gate electrode G to make it possible to restrain the generation of inconveniences, such as respective falls in the drain current of the high-breakdown-voltage pMOSFET and in the reliability thereof.

In the meantime, the high-breakdown-voltage nMOSFET mainly has an n-type buried layer NI (second n-type semiconductor layer), an n-type well region LNW, a p-type well region LPW, low-concentration n-type regions NNR, n-type dopant regions NR, a p-type dopant region PR, gate electrodes G, and an element isolation insulating film LS. These are formed in the semiconductor substrate SUB, which has the same p-type region PSR where the high-breakdown-voltage pMOSFET is formed. In the same manner as introduced into the p-type region PSR and the others, p-type dopant ions are introduced into the p-type well region LPW. In the same manner as introduced into the n-type dopant regions NR and the others, n-type dopant ions are introduced into the low-concentration n-type regions NNR.

A p-type region PSR of the high-breakdown-voltage nMOSFET, and the n-type buried layer NI thereof are common to those of the high-breakdown-voltage pMOSFET, respectively. In other words, the p-type region PSR of the high-breakdown-voltage nMOSFET, and that of the high-breakdown-voltage pMOSFET are present as the same layer, and further the n-type buried layer NI of the high-breakdown-voltage nMOSFET and that of the high-breakdown-voltage pMOSFET are present as the same layer.

A region from which drain electrodes D are taken out is made of one of the n-type dopant regions NR that is formed in the nMOSFET-side main surface MS of the semiconductor substrate SUB, and one of the low-concentration n-type regions NNR that is formed to surround the periphery of this region NR. It is preferred that the concentration of the n-type dopant in the low-concentration n-type region NNR is higher than that of the n-type dopant in the n-type well region LNW, and is lower than that of the n-type dopant in the n-type dopant region NR. Even when a high voltage is applied to the drain electrodes D, the structure described herein makes it possible to restrain the generation of inconveniences following a matter that an electric field becomes extremely high in the n-type dopant region NR and the vicinity thereof. A region from which source electrodes S are taken out may also have an n-type dopant region NR (as the other of the n-type dopant regions) and a low-concentration n-type region NNR (as the other of the low-concentration n-type regions NNR) formed to surround the periphery of the region NR.

The drain electrodes D, the dopant region from which the source electrodes S are taken out, and the gate electrodes G constitute n-type transistors NTR as the high-breakdown-voltage nMOSFET.

Furthermore, the p-type dopant region PR, from which the base potential B is taken out, has a function of connecting the base potential B and the p-type well region LPW electrically with each other to fix the potential of the p-type well region LPW.

The local n-type buried region RBN is a region in the high-breakdown-voltage pMOSFET which is a region arranged just below the first p-type dopant region from which the drain electrode D is taken out, that is, a region arranged at the p-type region PSR side of the first p-type dopant region. It is preferred that this local n-type buried region RBN is arranged just below the first p-type dopant region, particularly just below the p-type dopant region PR therein. It is however allowable that this region RBN is just below both of the p-type dopant region PR and the high-breakdown-voltage p-type drift layer HPDF, which constitute the first p-type dopant region.

As described above, the local n-type buried region RBN may be arranged to include a region just below the first p-type dopant region, from which the drain electrode D is taken out, or may be arranged to make the circumference thereof consistent with that of first p-type dopant region when viewed in plan (for example, this region RBN has the same plane surface shape as the first p-type dopant region so as to be laid underneath the first p-type region with substantially completely consistence in shape with the first p-type dopant region). The local n-type buried region RBN may be arranged to have the same plane surface shape as, in particular, the p-type dopant region PR in the first p-type dopant region, or may be arranged to have the same plane surface shape as a region made of a combination of the p-type dopant region PR and the high-breakdown-voltage p-type drift layer HPDF, which constitute the first p-type dopant region (that is, a region which is identical in shape to the high-breakdown-voltage p-type drift layer HPDF when viewed in plan).

Figure 4:
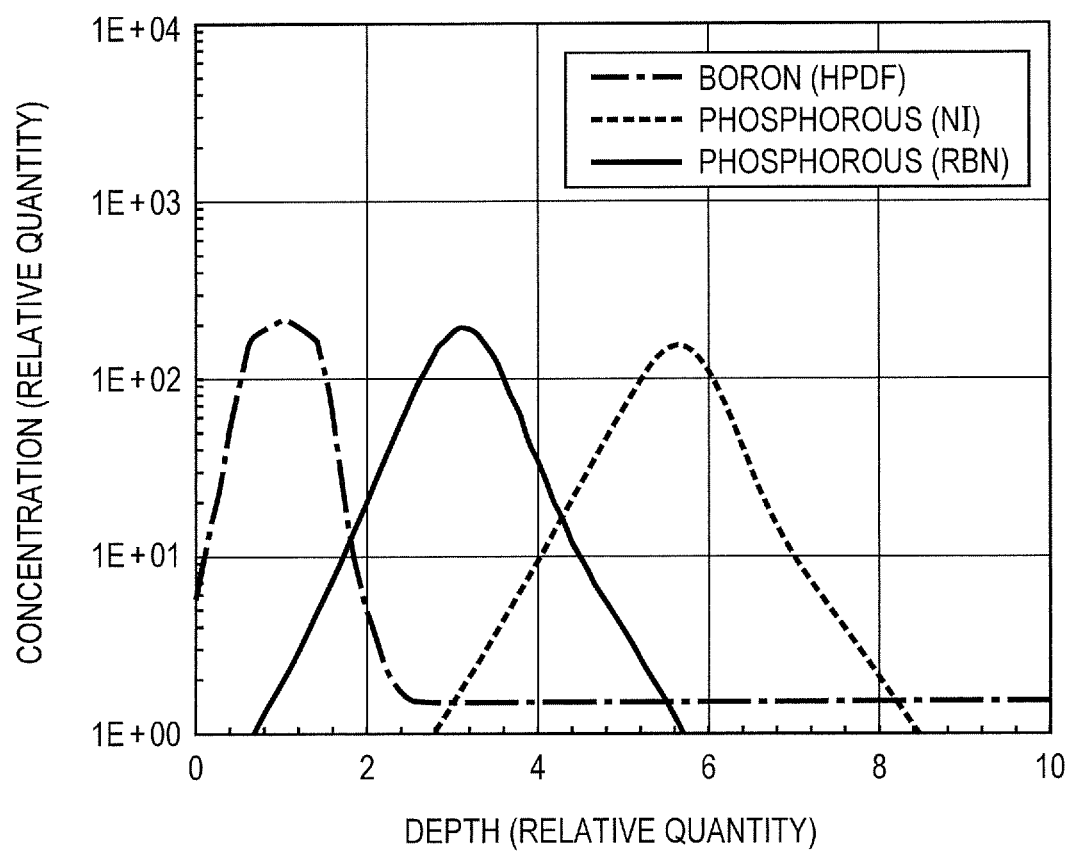
FIG. 4 is a concentration profile graph showing the respective concentrations of dopants in a region represented by "IV" in FIG. 2.

The transverse axis (depth) of a graph of FIG. 4 represents the relative quantity of the distance of any position in the vertical direction in FIG. 2 from the main surface MS of the semiconductor substrate SUB inside the semiconductor substrate SUB in FIG. 2. The vertical axis (concentration) of the graph of FIG. 4 represents the relative quantity of the concentration of the dopant (boron in the p-type dopant region or phosphorous in the n-type dopant region) in this depth-region.

The local n-type buried region RBN in FIG. 2 is defined as a region where the concentration of phosphorous, which is a dopant, introduced for forming this region RBN is higher than not only that of the dopant introduced for forming any one of the other regions (for example, phosphorous for forming the n-type buried layers NI, or boron for forming the high-breakdown-voltage p-type drift layer HPDF), but also the concentration of the p-type dopant in the p-type region PSR. Similarly, the high-breakdown-voltage p-type drift layer HPDF in FIG. 2 is defined as a region where the concentration of boron for forming this layer HPDF is higher than that of the dopant for forming any one of the other regions (including the p-type region PSR). The n-type buried layers NI in FIG. 2 are each defined as a region where the concentration of phosphorous for forming this layer is higher than that of the dopant for forming any one of the other regions (including the p-type region PSR).

As shown in FIGS. 2 and 4, in the present embodiment, the local n-type buried region RBN is arranged at the main surface MS side, that is, the upside (in FIG. 2) of one of the n-type buried layers NI (i.e., at the left side of an NI-corresponding position in FIG. 4). In the embodiment, a position where the phosphorous concentration in the local n-type buried region RBN becomes maximum is arranged, in particular, at the main surface MS side, that is, the upside (in FIG. 2) of a position where the phosphorous concentration in the n-type buried layer NI becomes maximum, and is further arranged at the p-type region PRS side, that is, the downside (in FIG. 2) of a position where the boron concentration in the high-breakdown-voltage p-type drift layer HPDF becomes maximum. In FIG. 4, the maximum dopant concentration in the local n-type buried region RBN is substantially equal to that in the n-type buried layer NI; however, the maximum dopant concentration in the local n-type buried region RBN may be higher than that in the n-type buried layer NI.

The local n-type buried region RBN is arranged to contact the n-type buried layer NI. In other words, as illustrated in FIG. 4, the concentration profile of the local n-type buried region RBN meets that of the n-type buried layer NI while as illustrated in FIG. 2, the present device does not include, between the local n-type buried region RBN and the n-type buried region NI, the other regions, such as the p-type region PSR.

As illustrated in the sectional view of FIG. 2, it is preferred that the local n-type buried region RBN is formed to contact the n-type well region LNW arranged, in the direction along the main surface MS, at both sides of the local n-type buried region RBN. In another wording, as illustrated in the sectional view of FIG. 2, it is preferred that the local n-type buried region RBN is arranged so as to be coupled to the n-type well region LNW portions or sections adjacent to each other, in the direction along the main surface MS, to the region RNB (i.e., so as to bridge the portions or sections of the n-type well region LNW). The local n-type buried region RBN attains connection between the n-type well region LNW portions or sections, the portions or sections being arranged oppositely to each other (at the right and left sides of the high-breakdown-voltage p-type drift layer HPDF in FIG. 2) across the first p-type dopant region (high-breakdown-voltage p-type drift layer HPDF) in the direction along the main surface MS. In still another wording, it is preferred that the n-type well region LNW surrounds the local n-type buried region RBN to contact this local n-type buried region RBN. The n-type well region LNW may surround the local n-type buried region RBN to contact the first p-type dopant region (high-breakdown-voltage p-type drift layer HPDF).

With reference to FIGS. 5 to 14, a description will be made about a method for producing the semiconductor device of the embodiment.

Figure 5:
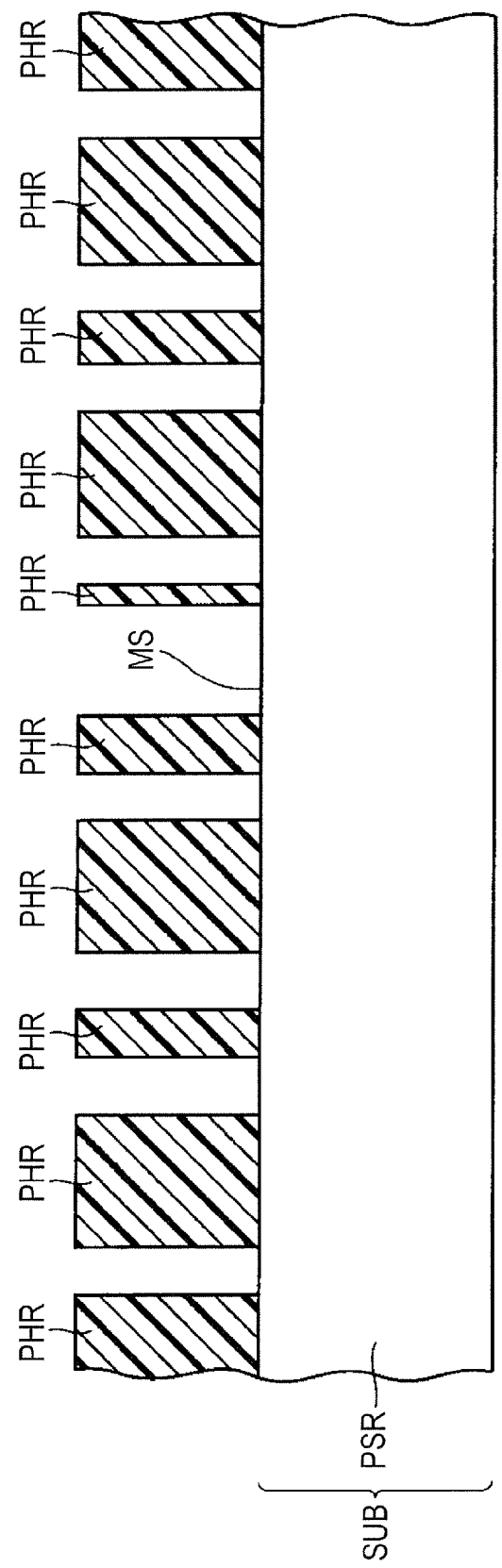
FIG. 5 is a schematic sectional view illustrating the region illustrated by FIG. 2 in a first step in a producing method according to first embodiment.

As illustrated in FIG. 5, prepared is first a semiconductor substrate SUB made of silicon monocrystal and having, for example, a p-type region PSR containing therein a p-type dopant. An ordinary photolithography (light exposure technique and development technique) is used to form, onto one MS of the two main surfaces of the semiconductor substrate SUB, a pattern of a photoresist PHR where openings are made in regions where an element isolation insulating film LS is to be formed when the photoresist PHR is viewed in plan.

Figure 6:
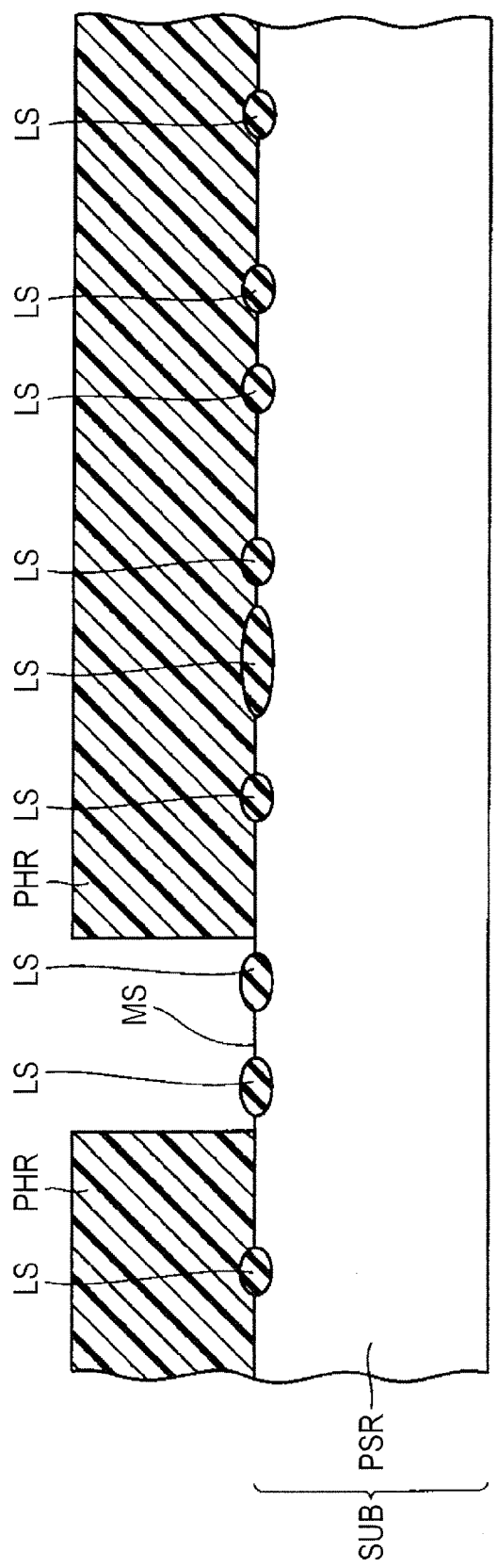
FIG. 6 is a schematic sectional view illustrating the region illustrated by FIG. 2 in a second step in the producing method according to first embodiment.

As illustrated in FIG. 6, for example, through an ordinary LOCOS or STI process, the element isolation insulating film LS (described just above) which is, for example, a silicon oxide film is formed in regions of the main surface MS which correspond to the openings in the photoresist PHR.

Next, the photoresist PHR is removed, and then a silicon oxide film having a thickness of, for example, 10 to 50 nm both inclusive is formed on substantially the whole of the main surface MS, which step is not illustrated. Referring again to FIG. 6, next, an ordinary photolithography is used to form a pattern of a photoresist PHR wherein an opening is made in a region where a high-breakdown-voltage p-type drift layer HPDF is to be formed when the photoresist PHR is viewed in plan.

Figure 7:
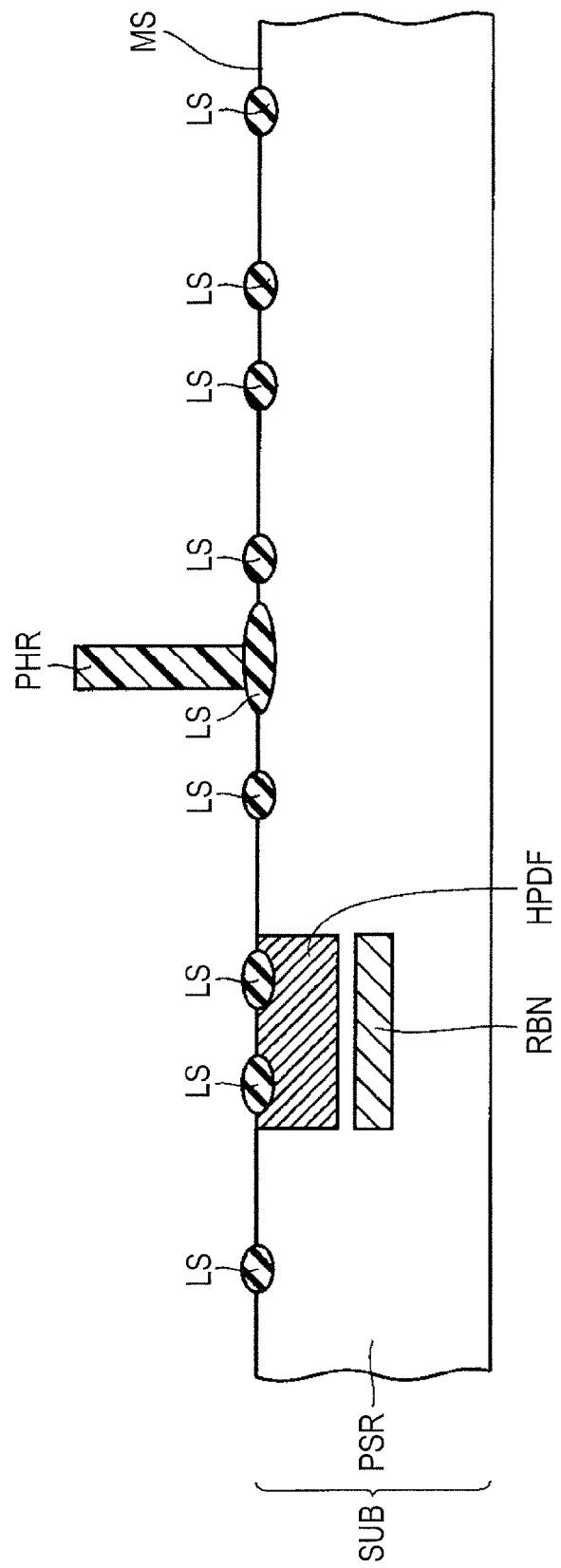
FIG. 7 is a schematic sectional view illustrating the region illustrated by FIG. 2 in a third step in the producing method according to first embodiment.

As illustrated in FIG. 7, by an ordinary ion implantation method, dopant ions of, for example, boron (B) are implanted plural times, at an energy of 50 to 300 keV both inclusive, into the main surface MS from above the surface MS. As a result, the high-breakdown-voltage p-type drift layer HPDF (described just above) is formed. Subsequently, by an ion implantation method, dopant ions of phosphorous (P) are implanted, at an energy of 500 keV to 2 MeV both inclusive, into the main surface MS from above the surface MS. As a result, a local n-type buried region RBN is formed.

Next, removed is the photoresist PHR (used to form the high-breakdown-voltage p-type drift layer HPDF and the local n-type buried region RBN), and then an ordinary photolithography is used to form a pattern of a photoresist PHR where openings are made in regions where n-type buried layers NI are to be formed when the photoresist PHR is viewed in plan.

Figure 8:
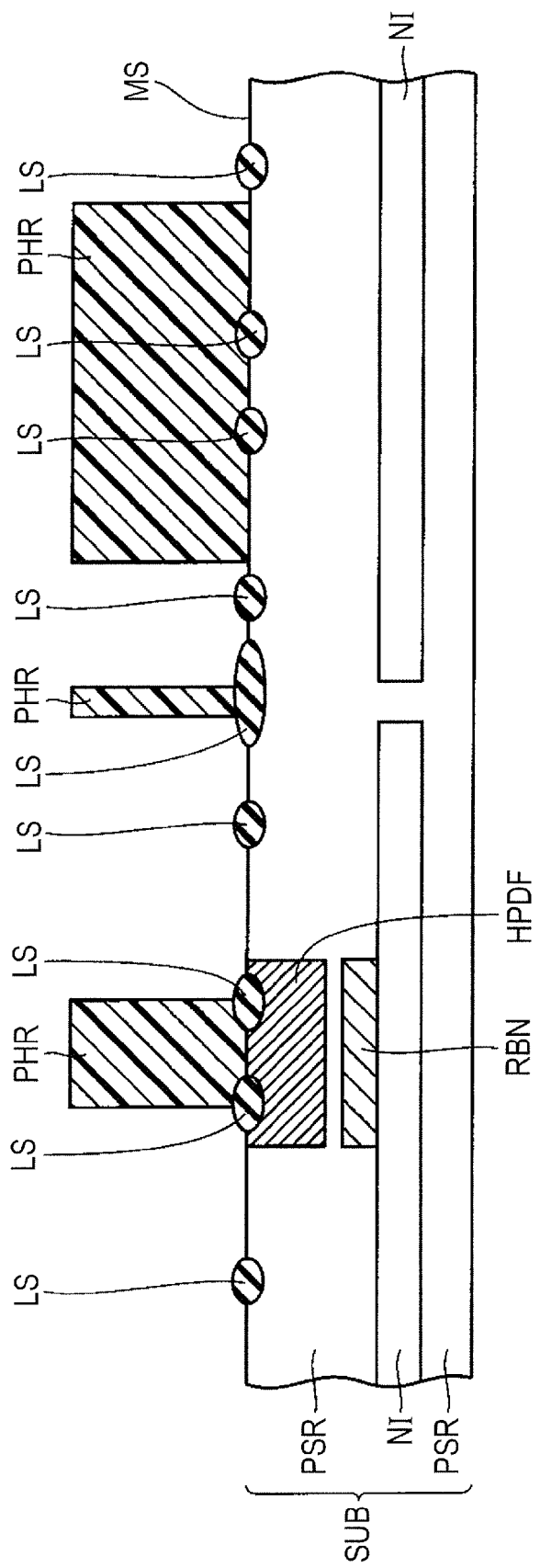
FIG. 8 is a schematic sectional view illustrating the region illustrated by FIG. 2 in a fourth step in the producing method according to first embodiment.

As illustrated in FIG. 8, by an ion implantation method, dopant ions of, for example, phosphorous (P) are implanted, at energy of 1 to 5 MeV both inclusive, into the main surface MS from above the surface MS. As a result, the n-type buried layers NI (described just above) are formed inside the semiconductor substrate SUB and at the main surface MS side (the upside) of the p-type region PSR. The n-type buried layers NI formed simultaneously in this step are: an n-type buried layer NI (first n-type semiconductor layer) in a high-breakdown-voltage pMOSFET region; and an n-type buried layer NI (second n-type semiconductor layer in a high-breakdown-voltage nMOSFET region.

Next, removed is the photoresist PHR (used to the n-type buried layers NI), and then an ordinary photolithography is used to form a pattern of a photoresist PHR where openings are made in a region where an n-type well region LNW is to be formed when the photoresist PHR is viewed in plan.

Figure 9:
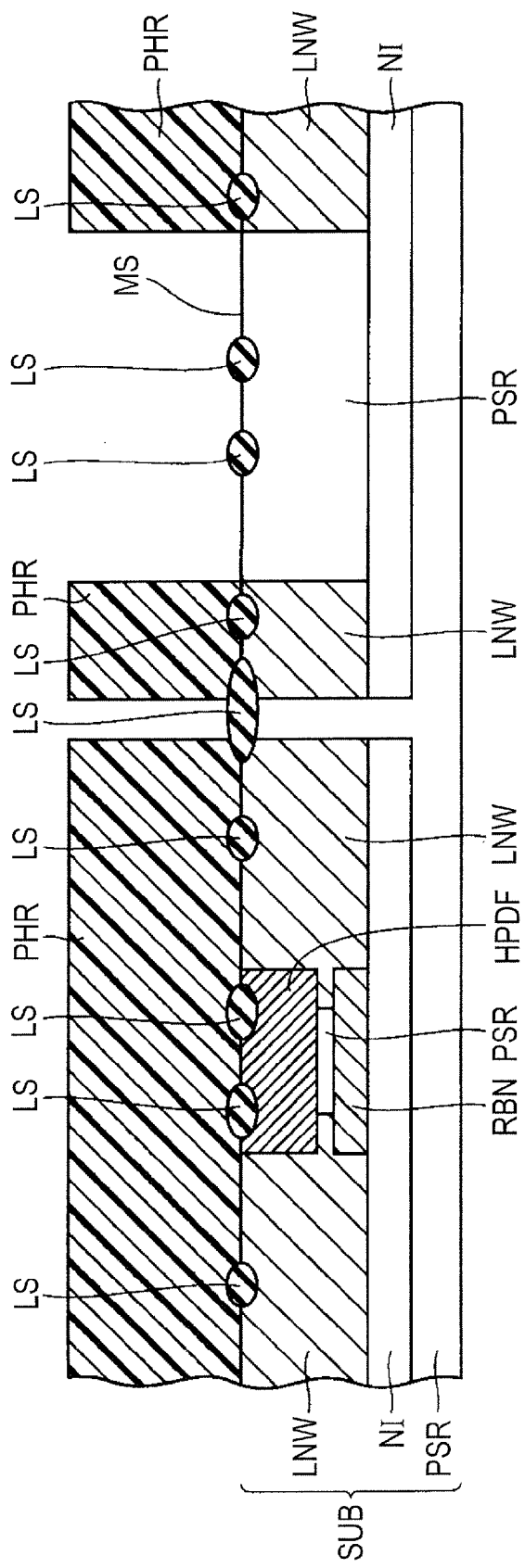
FIG. 9 is a schematic sectional view illustrating the region illustrated by FIG. 2 in a fifth step in the producing method according to first embodiment.

As illustrated in FIG. 9, by an ion implantation method, dopant ions of, for example, phosphorous (P) are implanted, at an energy of 150 to 2000 keV both inclusive, into the main surface MS from above the surface MS and further dopant ions of boron (B) are implanted, at an energy of 20 to 50 keV both inclusive, into the same. As a result, the n-type well region LNW (described just above) is formed.

Next, removed is the photoresist PHR (used to form the n-type well region LNW), and then an ordinary photolithography is used to form a pattern of a photoresist PHR where openings are made in a region where a p-type well region LPW is to be formed when the photoresist PHR is viewed in plan.

Figure 10:
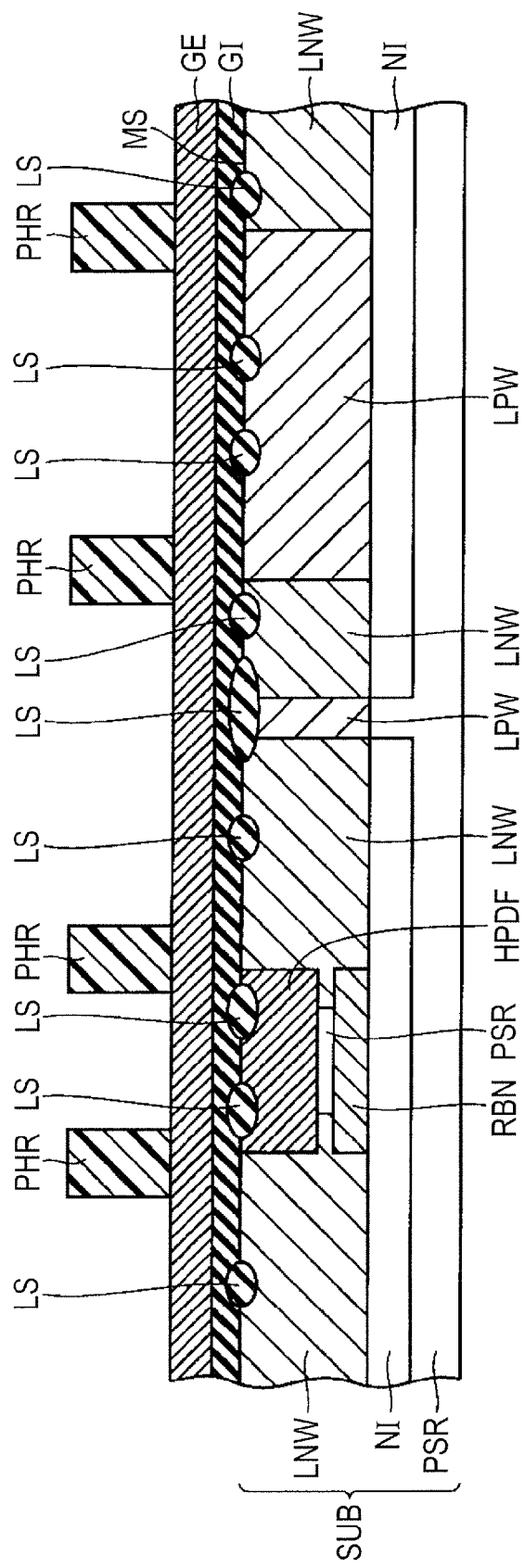
FIG. 10 is a schematic sectional view illustrating the region illustrated by FIG. 2 in a sixth step in the producing method according to first embodiment.

As illustrated in FIG. 10, by an ion implantation method, dopant ions of, for example, boron (B) are implanted, at an energy of 20 to 1000 keV both inclusive, into the main surface MS from above the surface MS. As a result, the p-type well region LPW (described just above) is formed.

Next, removed is the photoresist PHR (used to form the p-type well region LPW), and then removed is the silicon oxide film formed previously on substantially the whole of the main surface MS. Next, an ordinary thermal oxidation method is used to form an insulating film (GI) (i.e., asilicon oxide film having a thickness of 10 to 50 nm both inclusive) for forming a gate insulating film GI. An ordinary CVD (chemical vapor deposition) method is used to form a polycrystal silicon film (GE) for forming gate voltage applying regions GE.

Furthermore, an ordinary photolithography is used to form, on the polycrystal silicon film (GE), a pattern of a photoresist PHR wherein openings are made in regions where the insulating film (GI) and the polycrystal silicon film (GE) are to be removed when the photoresist PHR is viewed in plan.

Figure 11:
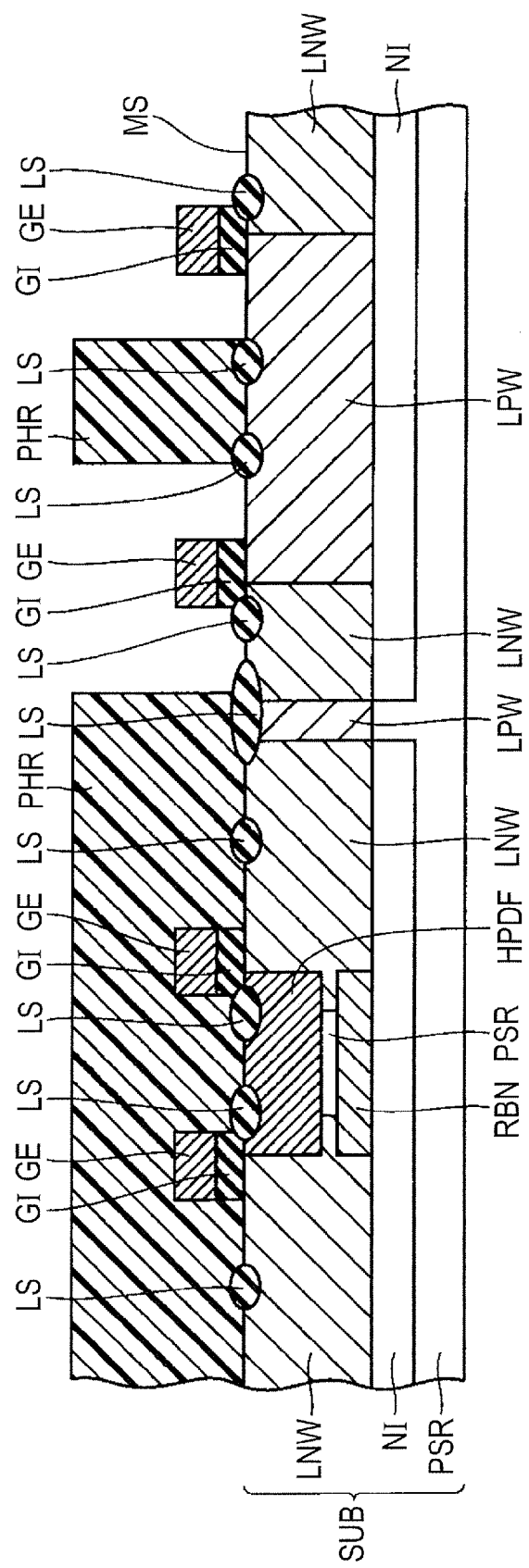
FIG. 11 is a schematic sectional view illustrating the region illustrated by FIG. 2 in a seventh step in the producing method according to first embodiment.

As illustrated in FIG. 11, the photoresist PHR pattern in FIG. 10 is used as a photomask to etch the insulating film (GI) and the polycrystal silicon film (GE) in an ordinary manner to form a gate insulating film as the film GI, and gate voltage applying regions as the regions GE.

Next, removed is the photoresist PHR (used to form the gate insulating film GI and the other), and then an ordinary photolithography is used to form a pattern of a photoresist PHR wherein openings are made in not only regions where low-concentration n-type regions NNR are to be formed when the photoresist PHR is viewed in plan, but also regions which are superposed on the gate voltage applying regions GE when the photoresist PHR is viewed in plan.

Figure 12:
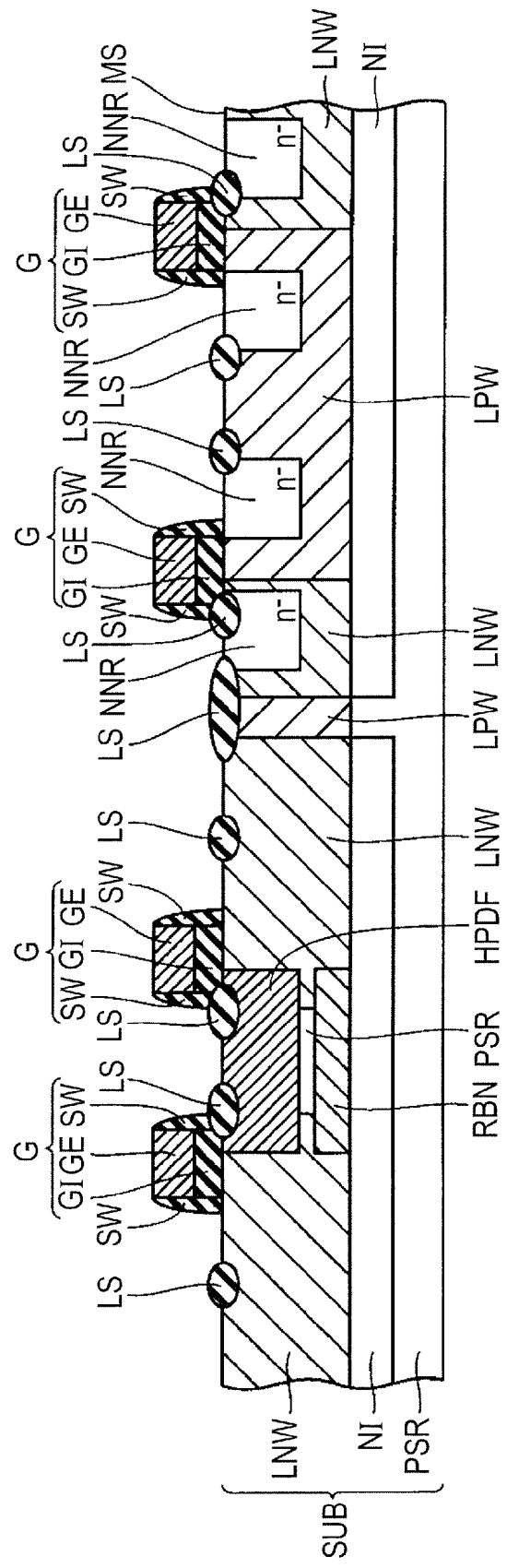
FIG. 12 is a schematic sectional view illustrating the region illustrated by FIG. 2 in an eighth step in the producing method according to first embodiment.

As illustrated in FIG. 12, by an ordinary ion implantation method, dopant ions of, for example, phosphorous (P) are implanted, at an energy of 50 to 200 keV both inclusive, into the main surface MS from above the surface MS. As a result, the low-concentration n-type regions NNR (described just above) are formed.

Next, removed is the photoresist PHR (used to form the low-concentration n-type regions NNR), and then a silicon oxide film is deposited onto substantially the whole of the main surface MS by, for example, a CVD method to cover the upper surfaces of the gate voltage applying regions GE and so on. The thickness of this silicon oxide film is preferably from 30 to 300 nm both inclusive. Thereafter, the silicon oxide film is etched back, thereby forming a side wall insulating film SW to cover side surfaces of the gate voltage applying regions GE and the gate insulating film GI. Through the steps described hereinbefore, gate electrodes G are formed.

Figure 13:
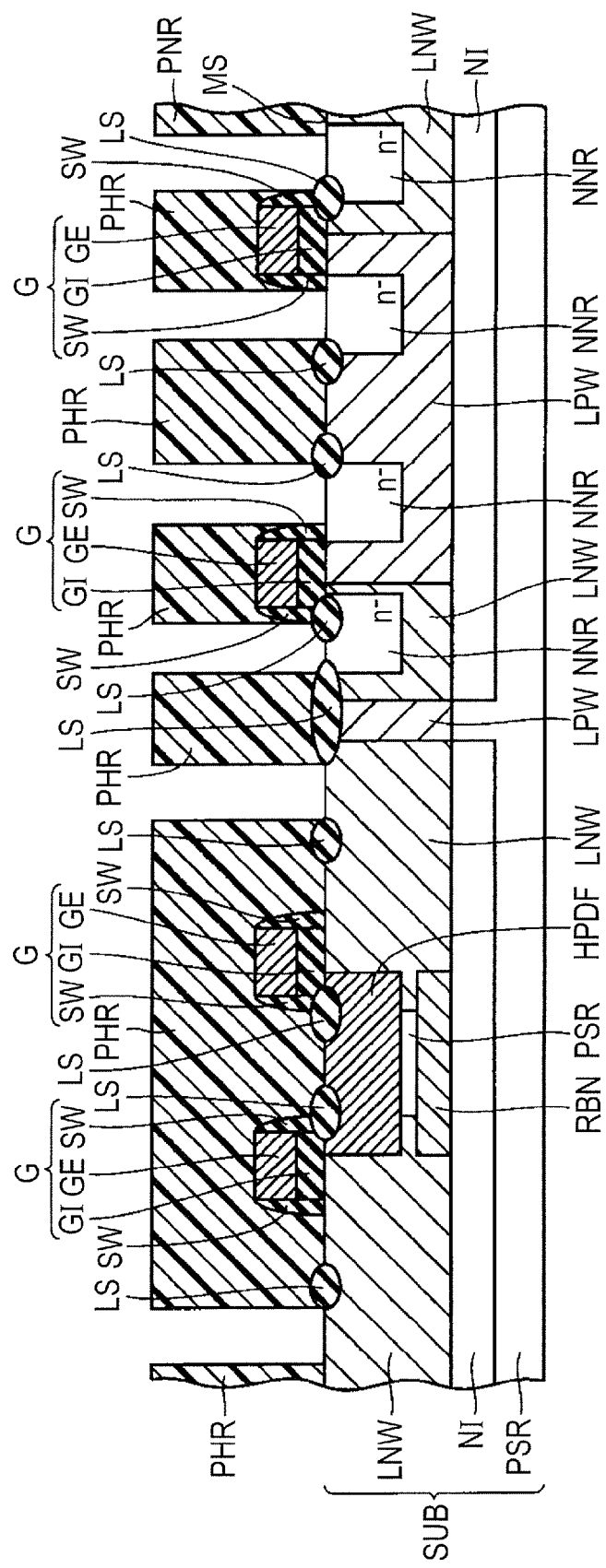
FIG. 13 is a schematic sectional view illustrating the region illustrated by FIG. 2 in a ninth step in the producing method according to first embodiment.

As illustrated in FIG. 13, an ordinary photolithography is used to form a pattern of a photoresist PHR wherein openings are made in regions where n-type dopant regions NR are to be formed when the photoresist PHR is viewed in plan.

Figure 14:
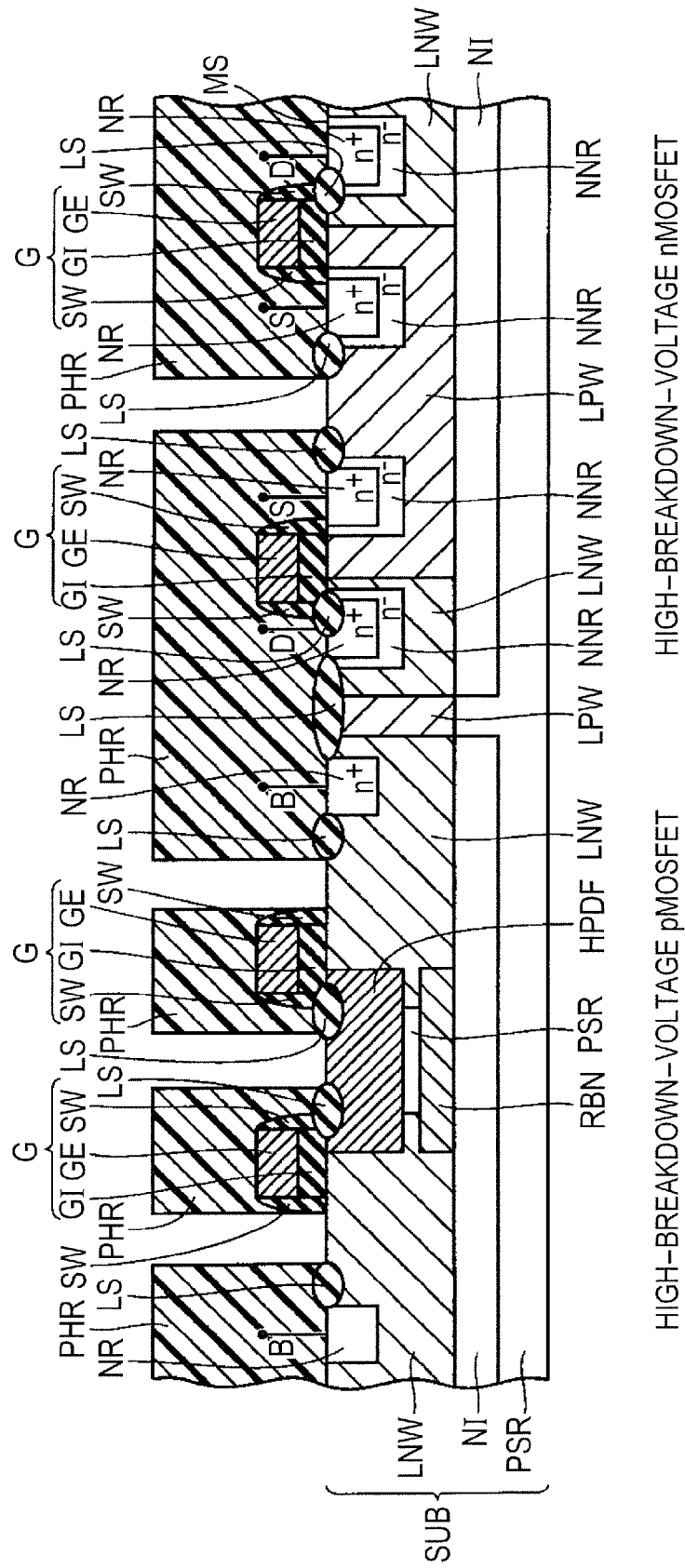
FIG. 14 is a schematic sectional view illustrating the region illustrated by FIG. 2 in a tenth step in the producing method according to first embodiment.

As illustrated in FIG. 14, by an ion implantation method, dopant ions of, for example, arsenic (As) are implanted, at an energy of 30 to 70 keV both inclusive, into the main surface MS from above the surface MS. As a result, the n-type dopant regions NR (described just above) are formed. In this way, formed are an (n-type) dopant region from which drain electrodes D and source electrodes S of the high-breakdown-voltage nMOSFET are taken out, and an (n-type) dopant region from which the base potential B of the high-breakdown-voltage pMOSFET is taken out.

Furthermore, removed is the photoresist PHR (used to form the n-type dopant regions NR), and then an ordinary photolithography is used to form a pattern of a photoresist PHR wherein openings are made in regions where p-type dopant regions PR are to be formed when the photoresist PHR is viewed in plan. Thereafter, by an ion implantation method, dopant ions of, for example, boron fluoride ($BF_2$) are implanted, at an energy of 20 to 60 keV both inclusive, into the main surface MS from above the surface MS. As a result, referring again to FIG. 2, the p-type dopant regions PR (described just above) are formed. In this way, formed are a (p-type) dopant region from which a drain electrode D and source electrodes S of the high-breakdown-voltage pMOSFET are taken out, and a (p-type) dopant region from which the base potential B of the high-breakdown-voltage nMOSFET is taken out. As a result, p-type transistors PTR and n-type transistors NTR are formed.

Just after each of the above-mentioned ion implantation methods is used to implant the dopant concerned, thereby forming the region concerned, the semiconductor substrate SUB is subjected to an ordinary thermal treatment to make the formed region into a stable state. Through each of the above-mentioned steps, the high-breakdown-voltage pMOSFET and the high-breakdown-voltage nMOSFET are formed, and simultaneously individual constituents of MOSFETs which constitute the low-voltage logic circuit and the others in FIG. 1 are also formed, which situation is not illustrated in any one of the figures.

Figure 15:
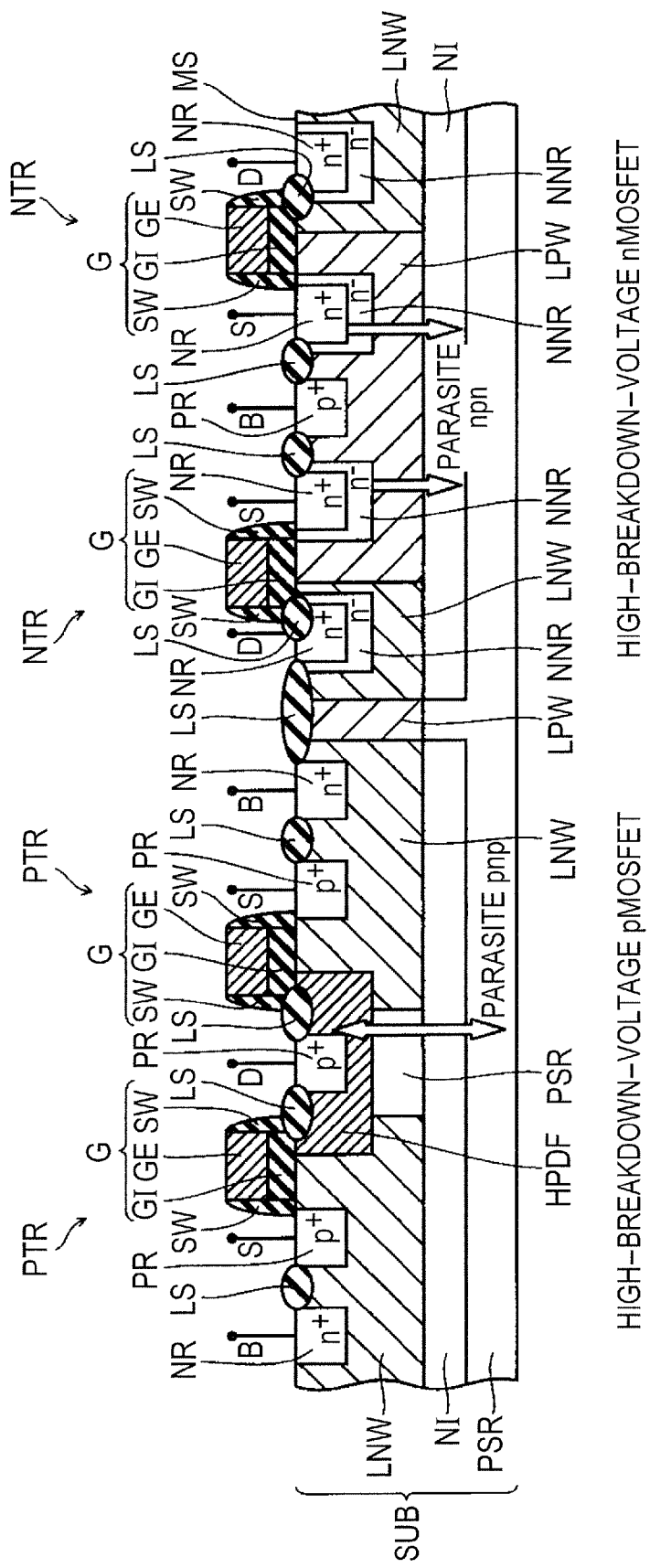
FIG. 15 is a schematic sectional view illustrating the configuration and the structure of MOSFETs in a region where a high-breakdown-voltage analogue I/O circuit is formed in a technique related to first embodiment.

The following will describe the effect and advantages of the present embodiment with reference to FIG. 15 illustrating a technique related to the embodiment.

As illustrated in FIG. 15, in the same manner as illustrated in FIG. 2, a region where a high-breakdown-voltage analogue I/O circuit as the technique related to the embodiment is formed has a high-breakdown-voltage pMOSFET and a high-breakdown-voltage nMOSFET. In FIG. 15, however, just below a p-type dopant region PR from which a drain electrode D of each p-type transistor PTR is taken out, no local n-type buried region RNB is arranged. The structure in FIG. 15 is different in this point from that illustrated in FIG. 2. However, in other points, the structure in FIG. 15 is equal to that in FIG. 2; thus, in FIG. 15, to the same constituting elements as in FIG. 2 are attached the same reference symbols, respectively. The description of the same elements is not repeated.

In the structure in FIG. 15, in the same way as in the present embodiment, the n-type buried layer NI, the n-type well region LNW, the high-breakdown-voltage p-type drift layer HPDF, and the others are each formed by an ion implantation method. In this case, therefore, costs for the production can be made lower than, for example, in the case of forming semiconductor layers by epitaxial growth as described in the above-mentioned publication (Patent Document 1).

As has been illustrated in FIG. 15, however, in this structure, a parasite pnp bipolar transistor may be generated among the high-breakdown-voltage p-type drift layer HPDF, the n-type buried layer NI just below the layer HPDF, and the p-type region PSR just below the layer NI, which are arranged in the vertical direction in FIG. 15. In particular, in a case where a reverse regenerative current flows from a motor or some other into the region from which the drain electrode D is taken out, the following probability is caused when this parasite pnp bipolar transistor acts: the reverse regenerative current partially flows as a leakage current toward the p-type region PSR (semiconductor substrate SUB) corresponding to the connector of the bipolar transistor so that elements around the present MOSFET malfunction, or the p-type transistors PTR are thermally broken.

In order to restrain the leakage current flowing toward the p-type region PSR (downward in FIG. 15), it is preferred to increase the dopant concentration in the n-type buried layer NI, which acts the base of the bipolar transistor, or increase the thickness (in the vertical direction in FIG. 15) of the n-type buried layer NI. This manner can be realized by increasing the dosage of ions implanted into the n-type buried layer NI, or apply multistep-implantation to the n-type buried layer NI. However, when this processing is applied to the structure in FIG. 15, the action of a parasite npn bipolar transistor is promoted although the effect of the parasite transistor onto each of the p-type transistors PTR is decreased; the parasite npn bipolar transistor is generated among the n-type dopant region NR and the low-concentration n-type region NNR, from which the source electrodes of the n-type transistors NTR are taken out, the p-type well region LPW just below the region NNR, and the n-type buried layer NI just below the region LPW. This is because the n-type dopant concentration in the n-type buried layer NI as the emitter of the npn bipolar transistor becomes high, or the n-type buried layer NI becomes thick. Since the parasite bipolar transistor of the n-type transistors NTR acts easily, the parasite transistor may cause the elements to malfunction in the same manner as described above.

The problems described just above can be solved, for example, by increasing the thickness of only the n-type buried layer NI of the p-type transistors PTR or by increasing the dopant concentration therein. However, in order to attain this manner, it is necessary to prepare one photomask additionally. Thus, the production costs may be increased.

Thus, as attained in the present embodiment (FIG. 2), the local n-type buried region RBN is arranged to contact the n-type buried layer NI, thereby increasing the n-type dopant region, as the base, substantially in thickness in the region where the parasite pnp bipolar transistor acts easily in FIG. 15. For this reason, in this region, the parasite pnp bipolar transistor comes not to act easily. Accordingly, the semiconductor device of the present embodiment makes it possible to restrain malfunctions of the peripheral circuit that are caused by the action of the parasite bipolar transistor, and thermal breaking of the p-type transistors PTR. This advantageous effect is further increased when the local n-type buried layer RBN is arranged at a position just below the region from which the drain electrode D of the high-breakdown-voltage p-type transistors PTR is taken out (the region: the p-type dopant region PR and the high-breakdown-voltage p-type drift layer HPDF) (i.e., a position where the circumference of the layer RBN is made consistent with that of the region from which the drain electrode D is taken out when the semiconductor device is viewed in plan) to have the same two-dimensional shape as the region from which the drain electrode D is taken out. This is because the parasite bipolar transistor is formed by a matter that the p-type region, the n-type region and the p-type region are arranged in turn along the vertical direction in FIG. 2.

The local n-type buried region RBN in the present embodiment is very advantageously usable particularly when a semiconductor device has a high-breakdown-voltage pMOSFET and a high-breakdown-voltage nMOSFET and further these MOSFETs have the same layer (the n-type buried layer NI in this embodiment) in common. This is because as described above, the form of the present embodiment is adopted in order to avoid an inconvenience (the promotion of the action of a parasite npn bipolar transistor) that may be caused in the high-breakdown-voltage nMOSFET by increasing the concentration of the n-type dopant in the n-type buried layer NI of the high-breakdown-voltage nMOSFET and the thickness of the n-type buried layer NI.

In the present embodiment, the local n-type buried region RBN is arranged to be coupled to portions or sections of the n-type well region that are arranged (at the right and left sides of the high-breakdown-voltage p-type drift layer HPDF in FIG. 2) to be opposite, in a direction along the main surface MS, to each other across the high-breakdown-voltage p-type drift layer HPDF. Therefore, for example, the p-type region PSR contacting the lower side of the high-breakdown-voltage p-type drift layer HPDF in FIG. 2 does not cause any connection between the high-breakdown-voltage p-type drift layer HPDF and the n-type buried layer NI. It is therefore possible to restrain the flowing of a leakage current into between the high-breakdown-voltage p-type drift layer HPDF and the n-type buried layer NI just below the layer HPDF (a current flowing from the high-breakdown-voltage p-type drift layer HPDF toward the n-type buried layer NI when a reverse regenerative current flows into the drain region). Thus, it is possible to restrain thermal breaking of the p-type transistors PTR and malfunctions of the peripheral circuit.

As attained in the present embodiment, the local n-type buried region RBN is present nearer to the main surface MS than the n-type buried layer NI is, thereby making it possible to make the distance shorter between the high-breakdown-voltage p-type drift layer HPDF and the n-type buried layer NI just below the layer HPDF. As a result, it is therefore possible to restrain the flowing of a leakage current into between the high-breakdown-voltage p-type drift layer HPDF and the n-type buried layer NI just below the layer HPDF (a current flowing from the high-breakdown-voltage p-type drift layer HPDF toward the n-type buried layer NI when a reverse regenerative current flows into the drain region). Thus, it is possible to restrain thermal breaking of the p-type transistors PTR and malfunctions of the peripheral circuit.

Furthermore, in the method for producing the present embodiment, the same photomask is used to form the high-breakdown-voltage p-type drift layer HPDF and the local n-type buried region RBN (continuously along time) to make it possible to reduce time and costs required for the production process. As described above, the local n-type buried region RBN and the high-breakdown-voltage p-type drift layer HPDF have the same two-dimensional shape, and further the local n-type buried region RBN is arranged just below the high-breakdown-voltage p-type drift layer HPDF to make the circumferences of the two completely consistent with each other when viewed in plan. Thus, using the same photomask, the local n-type buried region RBN and the high-breakdown-voltage p-type drift layer HPDF can easily be formed.

Herein, the present embodiment is compared with the prior art. In, for example, the technique of the above-mentioned publication, it is necessary to use separately one photomask exclusive to the formation of a buried layer. Furthermore, a thin film is formed by epitaxial growth to cover the buried layer; thus, much time and large costs are required for the production process. In the present embodiment, however, the local n-type buried region RBN can be formed, using a photomask for forming the high-breakdown-voltage p-type drift layer HPDF. Thus, it becomes unnecessary to prepare a photomask separately as performed in the publication, whereby time and costs required for the production process are largely reduced.

The technique of using, in this way, the same photomask as used for the high-breakdown-voltage p-type drift layer HPDF to form the local n-type buried region RBN can be realized by forming the local n-type buried region RBN just below the high-breakdown-voltage p-type drift layer HPDF to make the circumferences of the two completely consistent with each other (the two are made into the same two-dimensional shape) when viewed in plan.

Second Embodiment

The local n-type buried region RBN formed by ion implantation in the step illustrated in FIG. 7 can, with a higher certainty, restrain the action of a parasite bipolar transistor in the high-breakdown-voltage pMOSFET (p-type transistors PTR) and a leakage current, which follows the action, into the p-type region PSR (substrate leakage current) by varying conditions for forming the region RBN.

Specifically, the action and leakage current described just above can be restrained with a higher certainty, for example, by lowering the energy for the ion implantation for forming the local n-type buried region RBN, or increasing the dosage of the implanted ions.

Figure 16A:
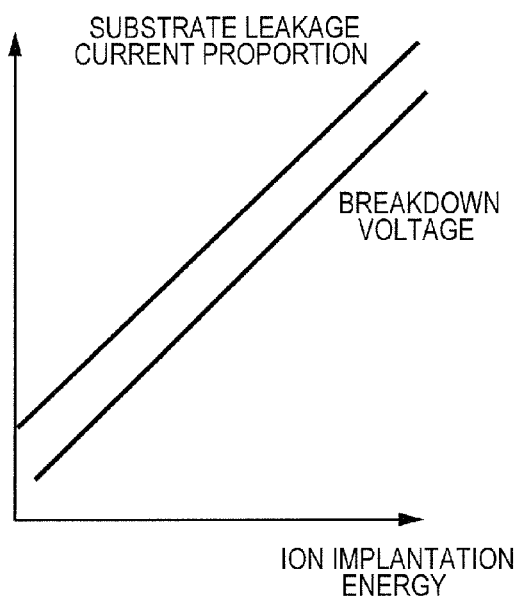
FIG. 16A is a graph showing a relationship between ion implantation energy for forming a local n-type buried region, and the substrate leakage current proportion and breakdown voltage (corresponding to the energy).

The transverse axis of FIG. 16A represents the magnitude of energy for ion implantation (for forming, for example, the local n-type buried region RBN), and the ordinate axis represents the proportion of the substrate leakage current of one of the p-type transistors PTR, and the magnitude of the breakdown voltage thereof. The substrate leakage current denotes the following out of components of a current flowing into the p-type dopant region PR from which the drain electrode is taken out when the motor or the like turns into a reverse regenerative state: a current component leaking through the parasite bipolar transistor of the p-type transistor PTR to the p-type region PSR of the semiconductor substrate SUB.

As illustrated in 16A, as the ion implantation energy is made lower, the local n-type buried region RBN in the p-type transistor PTR becomes thicker. As a result, the region functioning as the base of the parasite bipolar transistor of the p-type transistor PTR becomes thicker. Thus, the function of the p-type transistor PTR as the bipolar transistor is deteriorated so that the proportion of the substrate leakage current can be lowered.

Figure 16B:
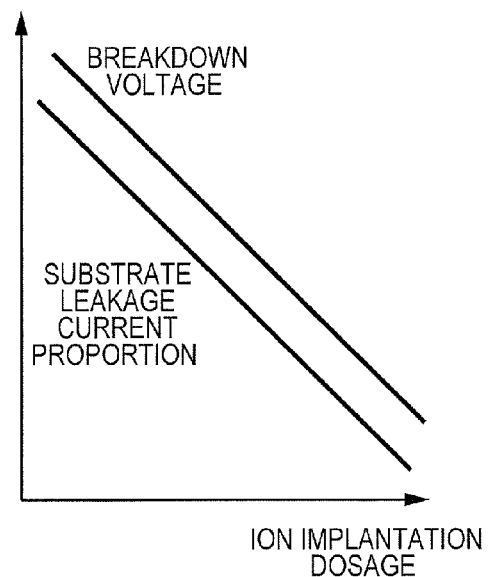
FIG. 16B is a graph showing a relationship between ion implantation dosage for forming the local n-type buried region, and the substrate leakage current proportion and breakdown voltage (corresponding to the dosage).

The transverse axis of FIG. 16B represents the dosage of ion implantation (for forming, for example, the local n-type buried region RBN), and the ordinate axis represents the proportion of the substrate leakage current of one of the p-type transistors PTR, and the magnitude of the breakdown voltage thereof.

As illustrated in 16B, as the ion implantation dosage is made larger, the dopant concentration in the local n-type buried region RBN in the p-type transistor PTR becomes higher. As a result, the region functioning as the base of the parasite bipolar transistor of the p-type transistor PTR becomes higher in dopant concentration. Thus, the function of the p-type transistor PTR as the bipolar transistor is deteriorated so that the proportion of the substrate leakage current can be lowered.

As has been shown in FIGS. 16A and 16B, in each of the case where the ion implantation energy is decreased and that where the ion implantation dosage is increased, the breakdown voltage of the p-type transistor PTR is declined. It is therefore desired to adjust the ion implantation energy and the ion implantation dosage in accordance with a specification required for the p-type transistor PTR.

The structural features of the present embodiment may be appropriately combined with those of first embodiment.

Third Embodiment

Figure 17:
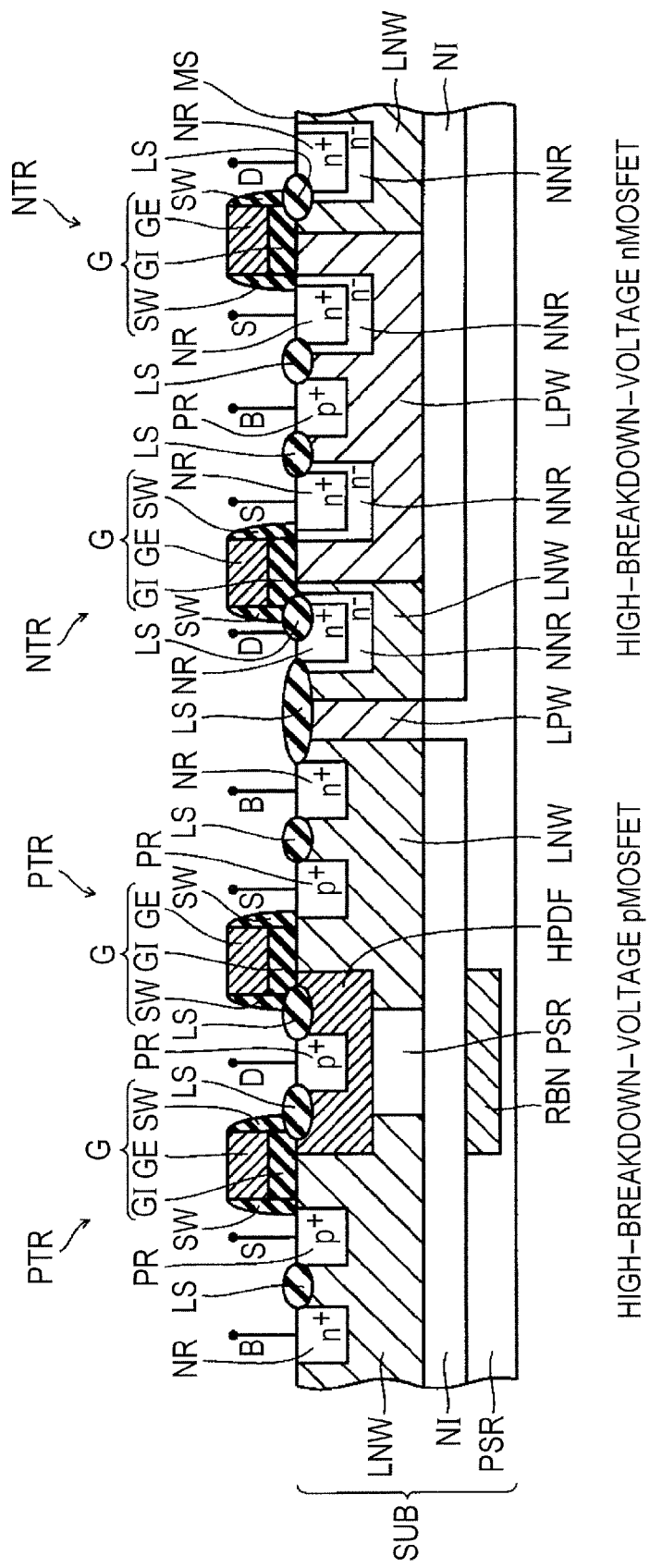
FIG. 17 is a schematic sectional view illustrating the configuration and the structure of MOSFETs in a region where a high-breakdown-voltage analogue I/O circuit is formed in third embodiment of the invention.

As illustrated in FIG. 17, a region where a high-breakdown-voltage analogue I/O circuit is formed in the present embodiment basically has the same structure as the region where the high-breakdown-voltage analogue I/O circuit is formed in first embodiment illustrated in FIG. 2. In the present embodiment, however, a local n-type buried region RBN is arranged at a side of an n-type buried layer NI opposite to the main-surface-MS-side of the layer NI, that is, the downside of the layer NI in FIG. 2 (i.e., at the right side of the NI-corresponding position in FIG. 4) to contact the n-type buried layer NI. Accordingly, the local n-type buried region RBN in the present embodiment is arranged to be surrounded by (or embedded in) a p-type region PSR of a semiconductor substrate SUB.

In the present embodiment also, a desired semiconductor device is formed by a producing method basically equivalent to the method described in first embodiment (see FIGS. 5 to 14). In the present embodiment, however, in the step illustrated in FIG. 7 for first embodiment, it is preferred to set, into the range of 2.6 to 5 MeV both inclusive, the energy for implanting dopant ions of phosphorous (P) when the local n-type buried region RBN is formed. In this way, the local n-type buried region RBN is formed at a region deeper than the region-RBN-formed region in FIG. 7 illustrating first embodiment.

In this point, the structure in FIG. 17 is different from that in FIG. 2. However, in other points, the structure in FIG. 17 is equal to that in FIG. 2; thus, in FIG. 17, to the same constituting elements as in FIG. 2 are attached the same reference symbols, respectively. The description of the same elements is not repeated.

The following will describe the effect and advantages of the present embodiment. The embodiment produces the following effect and advantages besides those of first embodiment.

When the present embodiment is compared with first embodiment, the local n-type buried region RBN is arranged at a region farther (deeper) from the main surface MS. Accordingly, the local n-type buried region RBN in the present embodiment is higher in ion implantation energy (shown in FIG. 16A), in the formation of the region RBN, than the local n-type buried region RBN in first embodiment. As has been shown in the graph of FIG. 16A, therefore, the p-type transistors PTR in the present embodiment are made larger in breakdown-voltage-improving effect than those in first embodiment.

The structural features of the present embodiment may be appropriately combined with those of first embodiment and/or second embodiment.

Fourth Embodiment

Figure 18:
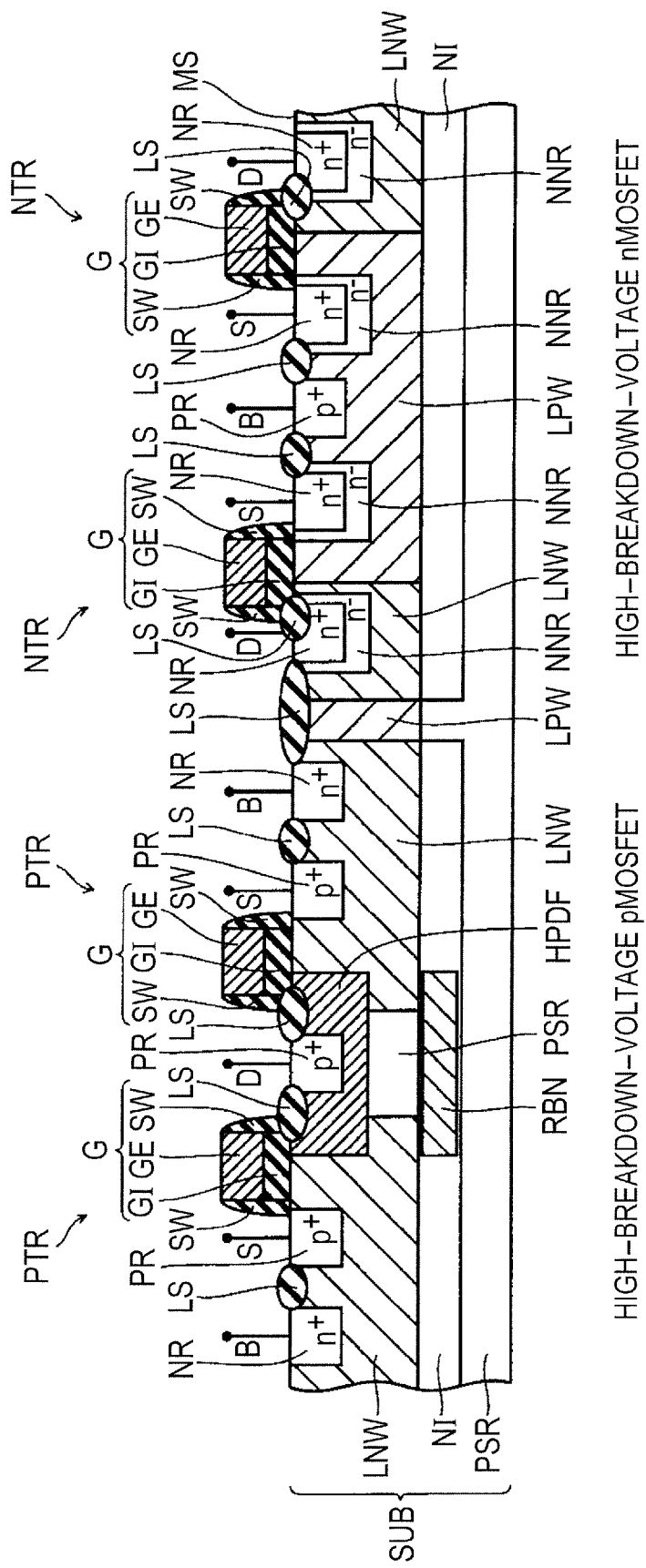
FIG. 18 is a schematic sectional view illustrating the configuration and the structure of MOSFETs in a region where a high-breakdown-voltage analogue I/O circuit is formed in fourth embodiment of the invention.

As illustrated in FIG. 18, a region where a high-breakdown-voltage analogue I/O circuit is formed in the present embodiment basically has the same structure as the region where the high-breakdown-voltage analogue I/O circuit is formed in first embodiment illustrated in FIG. 2. In the present embodiment, however, a local n-type buried region RBN is arranged inside an n-type buried layer NI. Accordingly, just below p-type dopant regions PR of a drain electrode D (and a high-breakdown-voltage p-type drift layer HPDF), the local n-type buried region RBN in the present embodiment is arranged in the same region where the n-type buried layer NI is formed.

In this case, a region where the dopant concentration is made largest by the local n-type buried region RBN is present inside the n-type buried layer NI. In other words, the region where the dopant concentration is made largest is present at the same position (same coordinates), about the vertical direction in FIG. 18, where the n-type buried layer NI is present.

In the present embodiment also, a desired semiconductor device is formed by a producing method basically equivalent to the method described in first embodiment (see FIGS. 5 to 14). In the present embodiment, however, in the step illustrated in FIG. 7 for first embodiment, it is preferred to set, into the range of, for example, 2 to 3.5 MeV both inclusive, the energy for implanting dopant ions of phosphorous when the local n-type buried region RBN is formed; any energy in the range described just above is equivalent to the ion implantation energy when the n-type buried layer NI is formed. In this way, the local n-type buried region RBN is formed at a region deeper than the region-RBN-formed region in FIG. 7 illustrating first embodiment. In this way, the local n-type buried region RBN is formed in a region deeper than the region-RBN-formed region in FIG. 7 for first embodiment and shallower than that in FIG. 17 for third embodiment.

In this point, the structure in FIG. 18 is different from that in FIG. 2. However, in other points, the structure in FIG. 18 is equal to that in FIG. 2; thus, in FIG. 18, to the same constituting elements as in FIG. 2 are attached the same reference symbols, respectively. The description of the same elements is not repeated.

The following will describe the effect and advantages of the present embodiment. As described above, in the embodiment, the local n type buried region RBN is formed at the same position where the n-type buried layer NI is formed. However, when the dopant concentration profile thereof is considered, the formation of the local n type buried region RBN increases the thickness of the n-type dopant region just below the region where the drain electrodes are taken out, and the concentration of the n-type dopant in this region as this case is compared with a case where the local n type buried region RBN is not present. For this reason, the local n type buried region RBN in the present embodiment produces the same effect and advantages as the other embodiments.

The structural features of the present embodiment may be appropriately combined with those of first embodiment, second embodiment and/or third embodiment.

The above has specifically described the invention made by the inventors by way of the embodiments of the invention. However, the present invention is not limited into the embodiments, and may be, of course, modified into various forms as far as the modified embodiments do not depart from the subject matter of the invention.

What is claimed is:

1. A semiconductor device comprising a semiconductor substrate having a main surface and further having, in an internal region thereof, a p-type region, and a high-breakdown-voltage p-channel-type transistor in the semiconductor substrate,
    wherein the high-breakdown-voltage p-channel-type transistor comprises a first n-type semiconductor layer arranged in the semiconductor substrate and at a side of the p-type region closer to the main-surface, a first p-type dopant region formed over the p-type region and in the main surface to form a drain electrode, a second p-type dopant region formed over the p-type region and in the main surface to form a source electrode, and a local n-type buried region arranged below the first p-type dopant region to contact the first n-type semiconductor layer,
    wherein the first p-type dopant region includes a p-type dopant ions region and a p-type drift region directly surrounding the p-type dopant ions region.

2. The semiconductor device according to claim 1, further comprising a high-breakdown-voltage n-channel-type transistor in the semiconductor substrate, wherein the high-breakdown-voltage n-channel-type transistor comprises a second n-type semiconductor layer as a layer identical to the first n-type semiconductor layer of the high-breakdown-voltage p-channel-type transistor.

3. The semiconductor layer according to claim 1, wherein the local n-type buried region is laid underneath the first p-type dopant region to make circumferences of the local n-type buried region and the first p-type dopant region consistent with each other when viewed in plan, to have identical two-dimensional shape as the first p-type dopant region.

4. The semiconductor device according to claim 1, further comprising one or more additional high-breakdown-voltage p-channel-type transistors equivalent to the high-breakdown-voltage p-channel-type transistor are formed in the semiconductor substrate; each of the high-breakdown-voltage p-channel-type transistors comprises an n-type well region formed in the main surface to surround the second p-type dopant region of the transistor; the local n-type buried region of the transistor attains connection between portions or sections of the n-type well region that are arranged to be opposite, in a direction along the main surface, to each other across the first p-type dopant region of the transistor.

5. The semiconductor device according to claim 1, wherein the local n-type buried region is present nearer to the main surface than the first n-type semiconductor layer is.

6. The semiconductor device according to claim 1, wherein the local n-type buried region is present inside the first n-type semiconductor layer.

7. The semiconductor device according to claim 1, wherein the local n-type buried region is present nearer to the p-type region than the first n-type semiconductor layer is.

8. The semiconductor device according to claim 1, wherein the local n-type buried region is formed by an ion implantation method.

9. A semiconductor device, comprising:
a p-type layer formed in a substrate;
a first n-type semiconductor layer arranged on the p-type layer in the substrate;
a first p-type dopant region formed above the p-type region in the substrate corresponding to a drain electrode;
a second p-type dopant region formed above the p-type region in the substrate corresponding to a source electrode; and
a local n-type buried region arranged below the first p-type dopant region, between the first p-type dopant region and the p-type layer,
wherein the first p-type dopant region includes a p-type dopant ions region and a p-type drift region directly surrounding the p-type dopant ions region.

10. The semiconductor device according to claim 9, wherein the high-breakdown-voltage p-type drift layer is higher in concentration than the p-type region layer.

11. The semiconductor device according to claim 9, wherein the high-breakdown-voltage p-type drift layer is lower in concentration than the first p-type dopant region.

12. The semiconductor device according to claim 9, further comprising:
a third p-type dopant region corresponding to another source,
wherein the second p-type dopant is formed on a first side of the first p-type dopant region and the third p-type dopant is formed on a second side of the first p-type dopant region opposite to the first side.

13. The semiconductor according to claim 12, wherein the first p-type dopant and the second p-type dopant form a first high-breakdown-voltage p-channel-type transistor, and
wherein the first p-type dopant and the third p-type dopant form a second high-breakdown-voltage p-channel-type transistor.

14. The semiconductor according to claim 13, further comprising:
a first n-type well region formed to surround the second p-type dopant region of the first transistor; and
a second n-type well region formed to surround the third p-type dopant region of the second transistor,
wherein the local n-type buried region connects at least a portion of the first n-type well region and the second n-type well region.

* * * * *

UNITED STATES PATENT AND TRADEMARK OFFICE
CERTIFICATE OF CORRECTION

| | | |
|---|---|---|
| PATENT NO. | : 9,112,013 B2 | Page 1 of 1 |
| APPLICATION NO. | : 13/785674 | |
| DATED | : August 18, 2015 | |
| INVENTOR(S) | : Hirokazu Sayama | |

It is certified that error appears in the above-identified patent and that said Letters Patent is hereby corrected as shown below:

In The Claims

Column 16, Line 41: In Claim 3, delete "layer" and insert -- device --

Column 18, Line 9: In Claim 13, after "semiconductor" insert -- device --

Column 18, Line 15: In Claim 14, after "semiconductor" insert -- device --

Signed and Sealed this
Eighth Day of March, 2016

Michelle K. Lee
*Director of the United States Patent and Trademark Office*